United States Patent
Matsumoto et al.

(10) Patent No.: US 6,960,482 B2
(45) Date of Patent: Nov. 1, 2005

(54) METHOD OF FABRICATING NITRIDE SEMICONDUCTOR AND METHOD OF FABRICATING SEMICONDUCTOR DEVICE

(75) Inventors: Osamu Matsumoto, Miyagi (JP); Shinichi Ansai, Miyagi (JP); Satoru Kijima, Miyagi (JP)

(73) Assignee: Sony Corporation (JP)

( * ) Notice: Subject to any disclaimer, the term of this patent is extended or adjusted under 35 U.S.C. 154(b) by 18 days.

(21) Appl. No.: 10/184,902

(22) Filed: Jul. 1, 2002

(65) Prior Publication Data

US 2003/0082893 A1 May 1, 2003

(30) Foreign Application Priority Data

Jul. 2, 2001 (JP) ................................ P2001-200628

(51) Int. Cl.⁷ .............................................. H01L 21/00
(52) U.S. Cl. .......................... 438/22; 438/46; 438/604; 438/779
(58) Field of Search ..................... 438/22–47, 602–609, 438/779

(56) References Cited

U.S. PATENT DOCUMENTS

| | | | | |
|---|---|---|---|---|
| 5,902,130 A | * | 5/1999 | Passlack et al. | 438/604 |
| 6,057,564 A | * | 5/2000 | Rennie | 257/99 |
| 6,093,952 A | * | 7/2000 | Bandic et al. | 257/485 |
| 6,248,607 B1 | * | 6/2001 | Tsutsui | 438/46 |
| 6,586,328 B1 | * | 7/2003 | Adesida et al. | 438/628 |
| 2002/0004254 A1 | * | 1/2002 | Miki et al. | 438/46 |
| 2002/0055274 A1 | * | 5/2002 | Takeya | 438/796 |
| 2002/0072204 A1 | * | 6/2002 | Uemura et al. | 438/483 |
| 2002/0185732 A1 | * | 12/2002 | Ho et al. | 257/734 |
| 2003/0042496 A1 | * | 3/2003 | Sasaoka | 257/102 |

FOREIGN PATENT DOCUMENTS

JP 3-120885 5/1991

* cited by examiner

*Primary Examiner*—Savitri Mulpuri
(74) *Attorney, Agent, or Firm*—Rader, Fishman & Grauer PLLC; Ronald P. Kananen (57) ABSTRACT

A method of fabricating a nitride semiconductor includes the steps of forming a nitride semiconductor doped with a p-type impurity, treating the surface of the nitride semiconductor in an atmosphere containing active oxygen to remove carbon remaining on the surface and form an oxide film thereon, and activating the p-type impurity to turn the conductive type of the nitride semiconductor into a p-type. Since carbon remaining on the surface of the nitride semiconductor is removed and the oxide film is formed thereon, the surface of the nitride semiconductor is prevented from being deteriorated by the activating treatment and the rate of activating the p-type impurity is enhanced. As a result, it is possible to reduce the contact resistance of the nitride semiconductor with an electrode and, hence, the variation in characteristics of the nitride semiconductor.

16 Claims, 5 Drawing Sheets

METHOD OF FABRICATING NITRIDE SEMICONDUCTOR AND METHOD OF FABRICATING SEMICONDUCTOR DEVICE

BACKGROUND OF THE INVENTION

The present invention relates to a method of fabricating a nitride semiconductor, including the step of activating a p-type impurity, and a method of fabricating a semiconductor device using the same.

Nitride semiconductors such as GaN, AlGaN mixed crystal, and AlInGaN mixed crystal have been expected as materials for forming light emitting devices allowing emission of light in a wide range from a visible region to an ultraviolet region, or materials for forming electronic devices. In particular, light emitting diodes (LEDs) using nitride semiconductors already have been available and have become a focus of attention. The realization of semiconductor lasers (LDs) using nitride semiconductors also has been reported, and such LDs have been expected to be widely applicable, for example, as a light source for an optical disk drive.

By the way, to obtain excellent characteristics of such a device, it is important to bring an electrode into desirable ohmic-contact with the semiconductor for reducing the contact resistance therebetween. In this regard, for an n-type semiconductor, since a relatively high carrier concentration of the n-type semiconductor can be ensured by doping an n-type impurity, such as silicon (Si) in the semiconductor, an electrode can be easily brought into ohmic-contact with the n-type semiconductor.

For a p-type semiconductor, however, since a p-type impurity, such as magnesium (Mg), doped in the semiconductor is bonded with hydrogen (H), the rate of activating the p-type impurity is low, and thereby the carrier concentration of the semiconductor is as low as about $1 \times 10^{18}$ cm$^{-3}$. As a result, it is difficult to bring an electrode into desirable ohmic-contact with the semiconductor, so that there arise the problems that the operational voltage is increased and the characteristics are liable to be varied.

SUMMARY OF THE INVENTION

An object of the present invention is to provide a method of fabricating a nitride semiconductor, which is capable of reducing the contact resistance of the nitride semiconductor with an electrode, and a method of fabricating a semiconductor device using the same.

To achieve the above object, according to a first aspect of the present invention, there is provided a method of fabricating a nitride semiconductor, including the steps of: forming a nitride semiconductor doped with a p-type impurity; oxidizing the surface of the nitride semiconductor to form an oxide film thereon; and activating the p-type impurity to turn the conductive type of the nitride semiconductor into a p-type.

According to a second aspect of the present invention, there is provided a method of fabricating a nitride semiconductor, including the steps of: forming a nitride semiconductor doped with a p-type impurity; treating the surface of the nitride semiconductor in an atmosphere containing active oxygen; and activating the p-type impurity to turn the conductive type of the nitride semiconductor into a p-type.

According to a third aspect of the present invention, there is provided a method of fabricating a semiconductor device, including the steps of: growing a nitride semiconductor layer doped with a p-type impurity; oxidizing the surface of the nitride semiconductor layer to form an oxide film thereon; and activating the p-type impurity to turn the conductive type of the nitride semiconductor layer into a p-type.

According to a fourth aspect of the present invention, there is provided a method of fabricating a semiconductor device, including the steps of: growing a nitride semiconductor layer doped with a p-type impurity; treating the surface of the nitride semiconductor layer in an atmosphere containing active oxygen; and activating the p-type impurity to turn the conductive type of the nitride semiconductor layer into a p-type.

According to the method of fabricating a nitride semiconductor and the method of fabricating a semiconductor device using the same according to the present invention, since the surface of a nitride semiconductor is oxidized to form an oxide film or the surface of the nitride semiconductor is treated in an atmosphere containing active oxygen before activation of a p-type impurity, it is possible to prevent the surface of the nitride semiconductor from being deteriorated by an activating treatment.

BRIEF DESCRIPTION OF THE DRAWINGS

Other features and advantages of the present invention will be apparent from the following description taken in connection with the accompanying drawings, wherein.

DETAILED DESCRIPTION OF THE PREFERRED EMBODIMENTS

Figure 1:
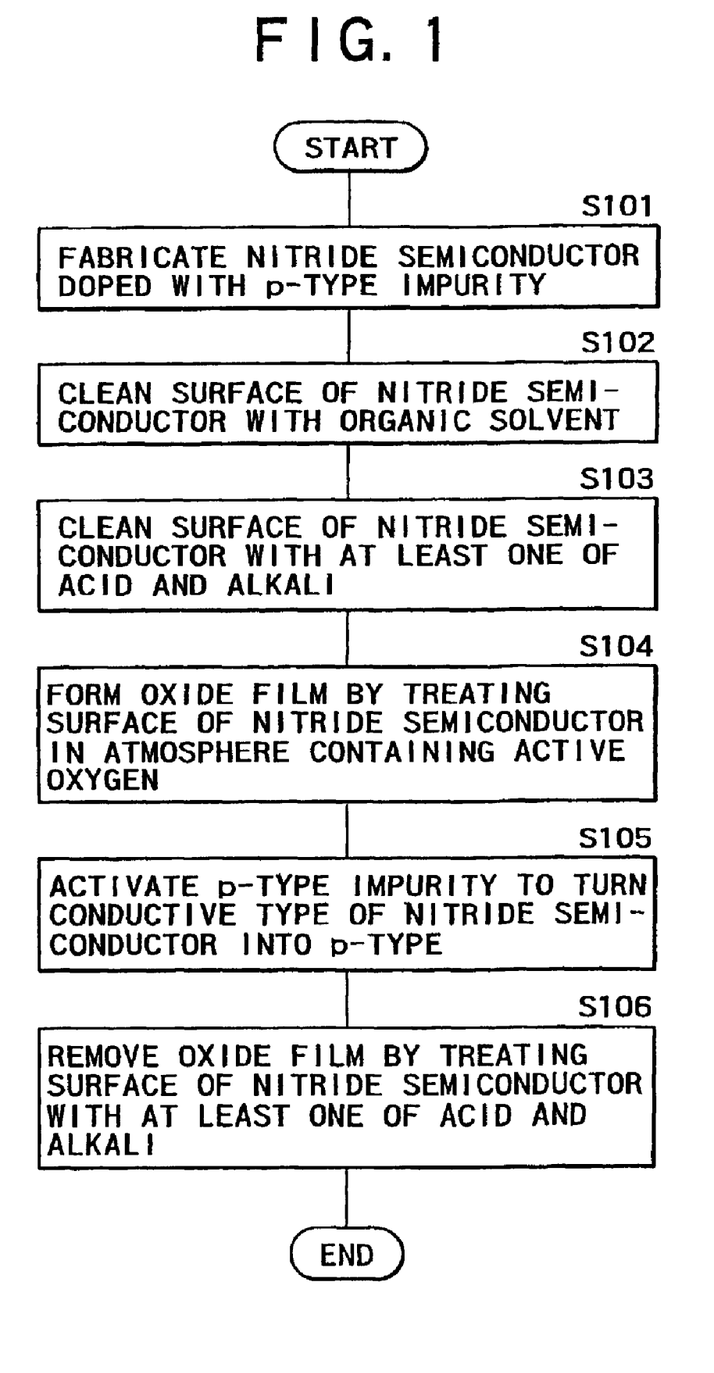
FIG. 1 is a flow diagram showing a method of fabricating a nitride semiconductor according to one embodiment of the present invention.
Figure 2A:
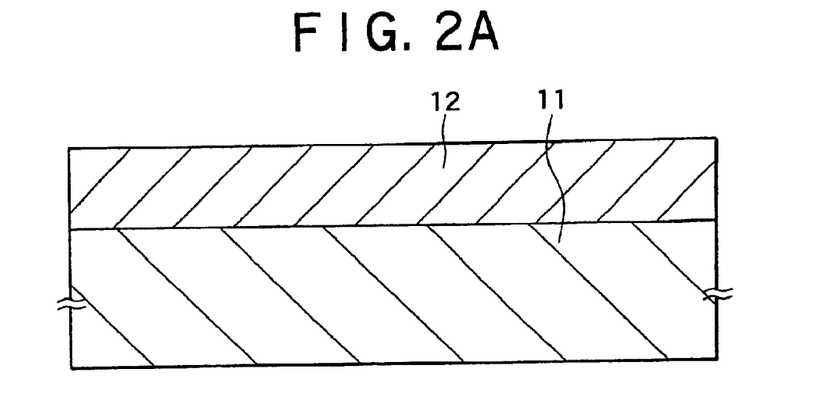
FIGS. 2A to 2C are sectional views showing steps of the method of fabricating a nitride semiconductor according to the embodiment of the present invention.
Figure 2B:
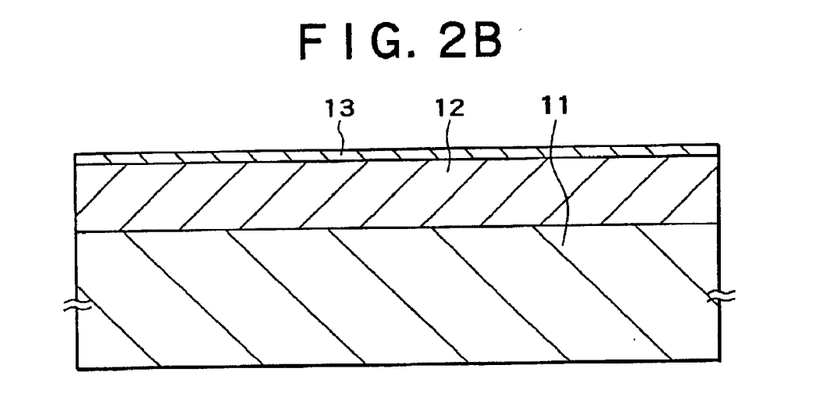
Figure 2C:
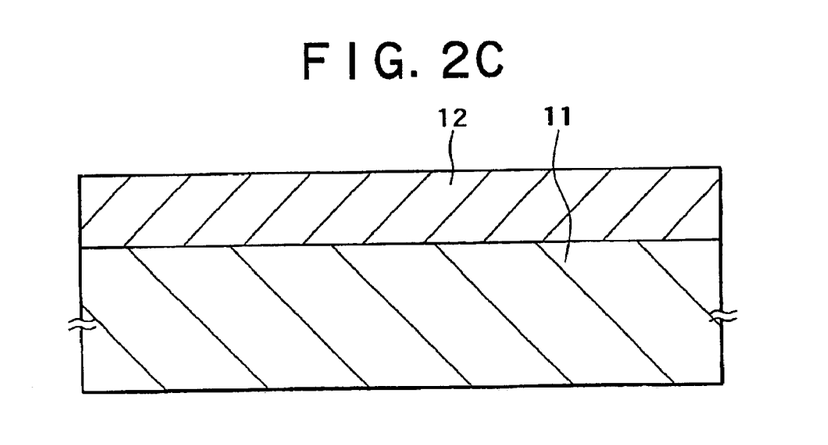

Hereinafter, embodiments of the present invention will be described in detail with reference to the accompanying drawings. FIG. 1 is a flow diagram showing a method of fabricating a nitride semiconductor according to a basic embodiment of the present invention, and FIGS. 2A to 2C are views showing the method of fabricating a nitride semiconductor in the order of fabrication steps. It is to be noted that the term "nitride semiconductor" means a semiconductor containing at least one kind selected from the group IIIB elements in the short-form periodic table, such as gallium (Ga), aluminum (Al), indium (In), and boron (B), and also containing at least nitride selected from the group VB elements in the short-form periodic table, such as nitrogen (N), arsenic (As), and phosphorous (P).

In step S101 shown in FIG. 2A, a nitride semiconductor 12 doped with a p-type impurity, such as magnesium, is grown on a C-plane of a substrate 11 typically made from sapphire ($\alpha$-Al$_2$O$_3$) by a MOCVD (Metal Organic Chemical Vapor Deposition) process. The nitride semiconductor 12 contains hydrogen atoms. The hydrogen atoms contained in the nitride semiconductor 12 are liable to be bonded to the p-type impurity to obstruct activation of the p-type impurity.

Examples of sources used for MOCVD include trimethyl gallium (($CH_3)_3$Ga) as a source gas for gallium, trimethyl aluminum (($CH_3)_3$Al) as a source gas for aluminum, trimethyl indium (($CH_3)_3$In) as a source gas for indium, trimethyl boron (($CH_3)_3$B) as a source gas for boron, ammonia ($NH_3$) as a source gas for nitrogen, and biscyclopentadienyl magnesium (($C_5H_5)_2$Mg) as a source gas for magnesium.

In step S102, the surface of the nitride semiconductor 12 is cleaned with an organic solvent, such as acetone, as needed to remove contaminants adhering on the surface of the nitride semiconductor 12. The surface of the nitride semiconductor 12 may be further cleaned with at least one of an acid and an alkali (Step S103). The acid used here preferably contains hydrofluoric acid (HF), and the alkali used here preferably contains potassium hydroxide (KOH), sodium hydroxide (NaOH), or ammonium hydroxide ($NH_4OH$).

In step S104 shown in FIG. 2B, the thus cleaned surface of the nitride semiconductor 12 is treated by irradiating the surface with ultraviolet rays in an atmosphere containing ozone ($O_3$), or treated by oxygen asher, that is, treated in an oxygen-containing plasma atmosphere caused by plasma discharge in an atmosphere containing oxygen ($O_2$). In this treatment, the surface of the nitride semiconductor 12 is exposed to the atmosphere containing active oxygen, that is, oxygen atoms produced by dissociation of ozone or oxygen. As a result, the surface of the nitride semiconductor 12 is oxidized to form an oxide film 13, and simultaneously carbon (c) and/or organic matters on the surface of the nitride semiconductor 12 not removed in the cleaning step are removed. These treatments are performed for preventing the surface of the nitride semiconductor 12 from being deteriorated in the subsequent treatment for activating the p-type impurity contained in the nitride semiconductor 12.

In particular, the surface treatment performed by irradiating the surface of the nitride semiconductor 12 with ultraviolet rays in an ozone-containing atmosphere is preferable. This is because the surface of the nitride semiconductor 12 is damaged less by irradiating the surface with ultraviolet rays. Such a treatment is preferably performed for one minute or more at room temperature.

The thickness of the oxide film 13 formed on the surface of the nitride semiconductor 12 is preferably in a range of five nm or less. If the thickness is larger than five nm, there may occur an inconvenience in reducing the rate of activating the p-type impurity in the subsequent step or increasing difficulty in removal of the oxide film 13 in the subsequent step. It is to be noted that the oxide film 13 means not a native oxide film formed as a result of exposure to air but an oxide film intendedly formed in a chamber.

In step S105, after the formation of the oxide film 13, the nitride semiconductor 12 is annealed at a temperature of 400° C. or more to release hydrogen from the nitride semiconductor 12, thereby activating the p-type impurity contained in the nitride semiconductor 12. As a result, the conductive type of the nitride semiconductor 12 becomes a p-type. According to this embodiment, since carbon remaining on the surface of the nitride semiconductor 12 is removed and the oxide film 13 is formed on the surface of the nitride semiconductor 12 before the activating treatment, the surface of the nitride semiconductor 12 is prevented from being deteriorated by the activating treatment. Also, the release of hydrogen is promoted by the presence of the oxide film 13, and the rate of activating the p-type impurity is improved.

In step S106 shown in FIG. 2C, after the activation of the p-type impurity, the surface of the nitride semiconductor 12 is treated with at least one of an acid and an alkali, as needed, to remove the oxide film 13. The acid used here preferably contains hydrofluoric acid, and the alkali used here preferably contains 3% or more of potassium hydroxide, sodium hydroxide, or ammonium hydroxide. The treatment temperature is preferably set to 100° C. or less. The treatment is preferably performed by using both an acid and an alkali, although it may be performed by using either an acid or an alkali. With respect to the order of treatment, any of the acid and alkali treatments may be performed earlier than the other.

With these treatments, it is possible to ensure a desirable interface with less deterioration, and hence to increase the rate of activating the p-type impurity contained in the nitride semiconductor.

A specific embodiment, in which a semiconductor laser representative of a semiconductor device is concretely fabricated by using the method of fabricating a nitride semiconductor according to the previous basic embodiment, will be described below.

Figure 3:
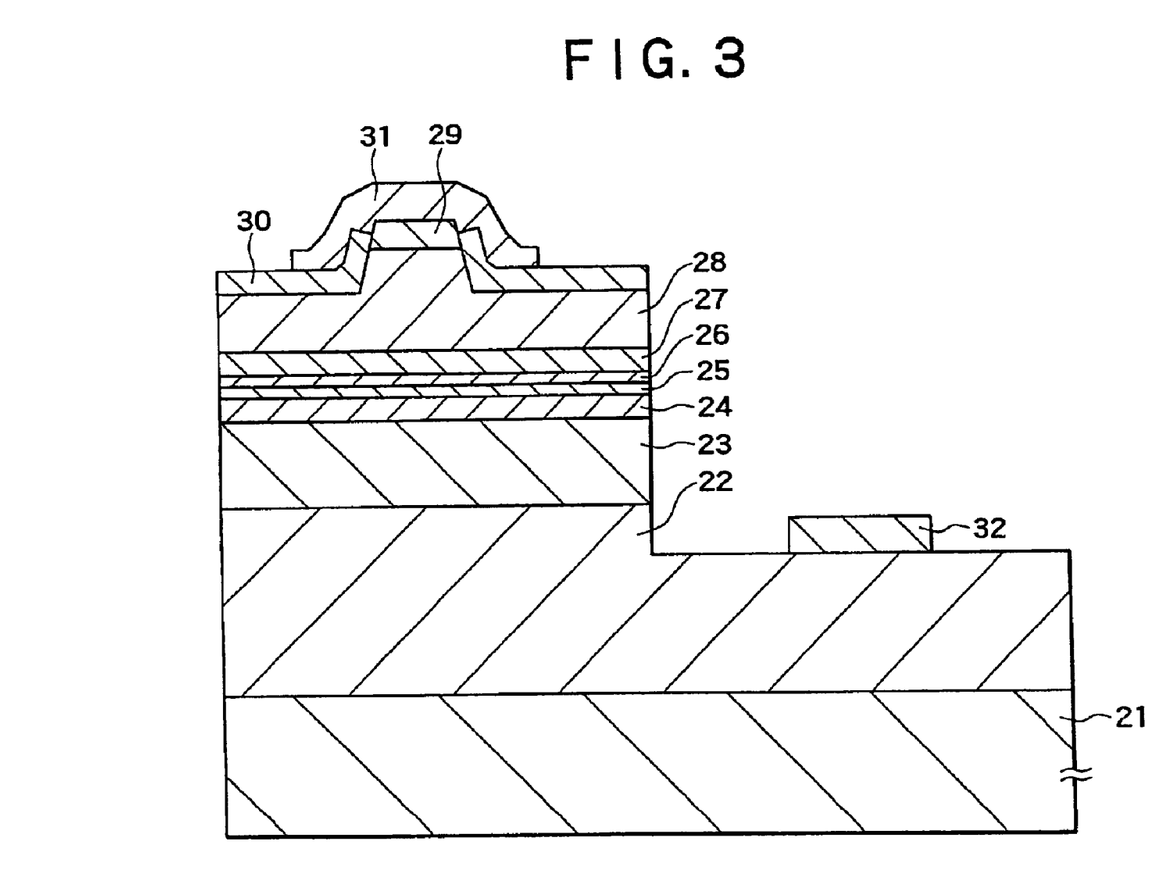
FIG. 3 is a sectional view showing a configuration of a semiconductor laser fabricated by using the method of fabricating a nitride semiconductor according to the embodiment of the present invention.

FIG. 3 shows a configuration of a semiconductor laser fabricated by using the fabrication method of a nitride semiconductor according to the previous basic embodiment. A substrate 21 made from sapphire is first prepared, and n-type nitride semiconductor layers are grown on a C-plane of the substrate 21 by a MOCVD process. For example, an n-type contact layer 22 made from n-type GaN doped with silicon as an n-type impurity, an n-type cladding layer 23 made from n-type AlGaN mixed crystal doped with silicon, and an n-type guide layer 24 made from n-type GaN doped with silicon are grown sequentially in this order on the substrate 21.

An active layer 25 having a multi-quantum well structure is grown on the surface of the stack of the n-type nitride semiconductor layers 22, 23 and 24. The multi-quantum well structure is composed of a stack of mixed crystal layers made from $Ga_xIn_{1-x}N$ ($1 \geq x \geq 0$) where the value of x differs among the mixed crystal layers.

After the growth of the active layer 25, nitride semiconductor layers doped with a p-type impurity are grown on the active layer 25 by the MOCVD process. For example, a current block layer 26 made from AlGaN mixed crystal doped with magnesium, a p-type guide layer 27 made from GaN doped with magnesium, a p-type cladding layer 28 made from AlGaN mixed crystal doped with magnesium, and a p-type contact layer 29 made from GaN doped with magnesium are grown sequentially in this order on the active layer 25.

Like the above-described fabrication method of the nitride semiconductor, the surface of the p-type contact layer 29 is cleaned with an organic solvent, as needed (see step S102 shown in FIG. 1), cleaned with at least one of an acid or an alkali (see step S103 shown in FIG. 1), and then treated in an atmosphere containing active oxygen to form an oxide film, which is not shown in FIG. 3 (see step S104 shown in FIG. 1).

After the formation of the oxide film, like the above-described fabrication method, the p-type impurity contained in each of the current block layer 26, the p-type guide layer 27, the p-type cladding layer 28, and the p-type contact layer 29 is activated to turn the conductive type of each of the layers into a p-type (see step S105 shown in FIG. 1). In this embodiment, since the nitride semiconductor layers are treated in the atmosphere containing active oxygen to form the oxide film thereon before the activating treatment, the surface of the p-type contact layer 29 is prevented from being deteriorated and, also, the carrier concentration of the p-type contact layer 29 is increased.

After the activation of the p-type impurity, like the above-described fabrication method, the surface of the p-type contact layer 29 is treated with at least one of an acid and an alkali, as needed, to remove the oxide film therefrom (see step 106 shown in FIG. 1). This treatment is not necessarily performed; however, it is preferably performed from the viewpoint of reducing the contact resistance of the p-type contact layer 29 with a p-side electrode 31 (which will be described later).

After the removal of the oxide film, a mask layer (not shown) is formed on the p-type contact layer 29, and portions of the p-type contact layer 29 and the p-type cladding layer 28 are selectively removed by RIE (Reactive Ion Etching) using the mask layer, to form an upper portion of the p-type cladding layer 28 and the p-type contact layer 29 into a ridge shape. The mask layer (not shown) is then removed, and an insulating film 30 made from silicon dioxide ($SiO_2$) is formed over the entire surface (that is, on the p-type cladding layer 28 and the p-type contact layer 29) by a vapor-deposition process. A resist film (not shown) is formed on the insulating film 30, and portions of the insulating film 30, the p-type cladding layer 28, the p-type guide layer 27, the current block layer 26, the active layer 25, the n-type guide layer 24, and the n-type cladding layer 23 are selectively removed sequentially in this order by RIE using the resist film as a mask to expose the n-type contact layer 22.

After the exposure of the n-type contact layer 22, the resist film (not shown) is removed, and another resist film (not shown) is formed over the entire surface (that is, on the insulating film 30 and the n-type contact layer 22). The insulating film 30 is selectively removed by using the resist film as a mask to expose the p-type contact layer 29. Subsequently, palladium (Pd), platinum (Pt) and gold (Au) are sequentially vapor-deposited selectively over the entire surface (that is, on the p-type contact layer 29 and the resist film not shown), and the resist film (not shown) is removed together with the metal (Pd/Pt/Au) stacked thereon by a lift-off process to form a p-side electrode 31. In this embodiment, since the surface of the p-type contact layer 29 is kept in the desirable state with less deterioration and the p-type contact layer 29 has the enhanced carrier concentration, the contact resistance of the p-type contact layer 29 with the p-side electrode 31 is reduced.

After the formation of the p-side electrode 31, a resist film (not shown) having an opening corresponding to the exposed portion of the n-type contact layer 22 is formed over the entire surface (that is, on the exposed portion of the n-type contact layer 22, the insulating film 30, and the p-side electrode 31). Subsequently, titanium (Ti), aluminum, and gold are sequentially vapor-deposited on the entire surface (that is, on the exposed portion of the n-type contact layer 22 and the resist film not shown) by a vacuum vapor-deposition process, and then the resist (not shown) is removed together with the metal (Ti/Al/Au) formed thereon by the lift-off process to form an n-side electrode 32.

The substrate 21 is ground until the thickness thereof becomes about 80 μm, and then cut into a specific size. Reflecting mirror films (not shown) are formed on a pair of opposed resonator end-faces in the extending direction of the p-side electrode 31 to accomplish a semiconductor laser shown in FIG. 3.

As described, according to this embodiment, since the surface of the nitride semiconductor 12 is treated in an atmosphere containing active oxygen so as to remove carbon remaining on the surface and form the oxide film 13 before activation of a p-type impurity, it is possible to prevent the surface of the nitride semiconductor 12 from being deteriorated in the activating treatment and to enhance the rate of activating a p-type impurity contained in the nitride semiconductor 12.

As a result, by fabricating a semiconductor laser by using such a method, it is possible to reduce the contact resistance of the p-type contact layer 29 with the p-side electrode 31, and hence to lower an operational voltage of the semiconductor laser and also to reduce a variation in the characteristics thereof.

In particular, by treating the formed oxide film using at least one of an acid and an alkali after activation of the p-type impurity, it is possible to reduce further the contact resistance of the p-type contact layer 29 with the p-side electrode 31, and hence to lower further the operational voltage of the semiconductor laser.

EXAMPLES

The method of fabricating a nitride semiconductor according to the present invention will be more fully apparent by way of the following examples.

Example 1

A plurality of substrates 21 were prepared, and a plurality of semiconductor lasers each having the same structure as that shown in FIG. 3 were fabricated on each of the substrates 21 in accordance with the fabrication method described in the specific embodiment of the present invention.

The surface treatments and the cleaning treatment were performed as follows. The surface treatment before activation of a p-type impurity was performed by irradiating the surface of a nitride semiconductor with ultraviolet rays for ten minutes in an atmosphere containing ozone at 80° C. (see step S104 shown in FIG. 1). The cleaning treatment before the above surface treatment was performed for five minutes by using acetone to which ultrasonic waves were applied (note: cleaning by using an acid and/or an alkali is not performed) (see steps S102 and S103 shown in FIG. 1). The surface treatment after activation of the p-type impurity was performed by dipping the substrate in a water solution containing potassium hydroxide at 60° C. for five minutes and then dipping the substrate in hydrofluoric acid at 50° C. for five minutes (see step S106 shown in FIG. 1). It is to be noted that the fabrication condition is common to all of the plurality of substrate 21.

Figure 4:
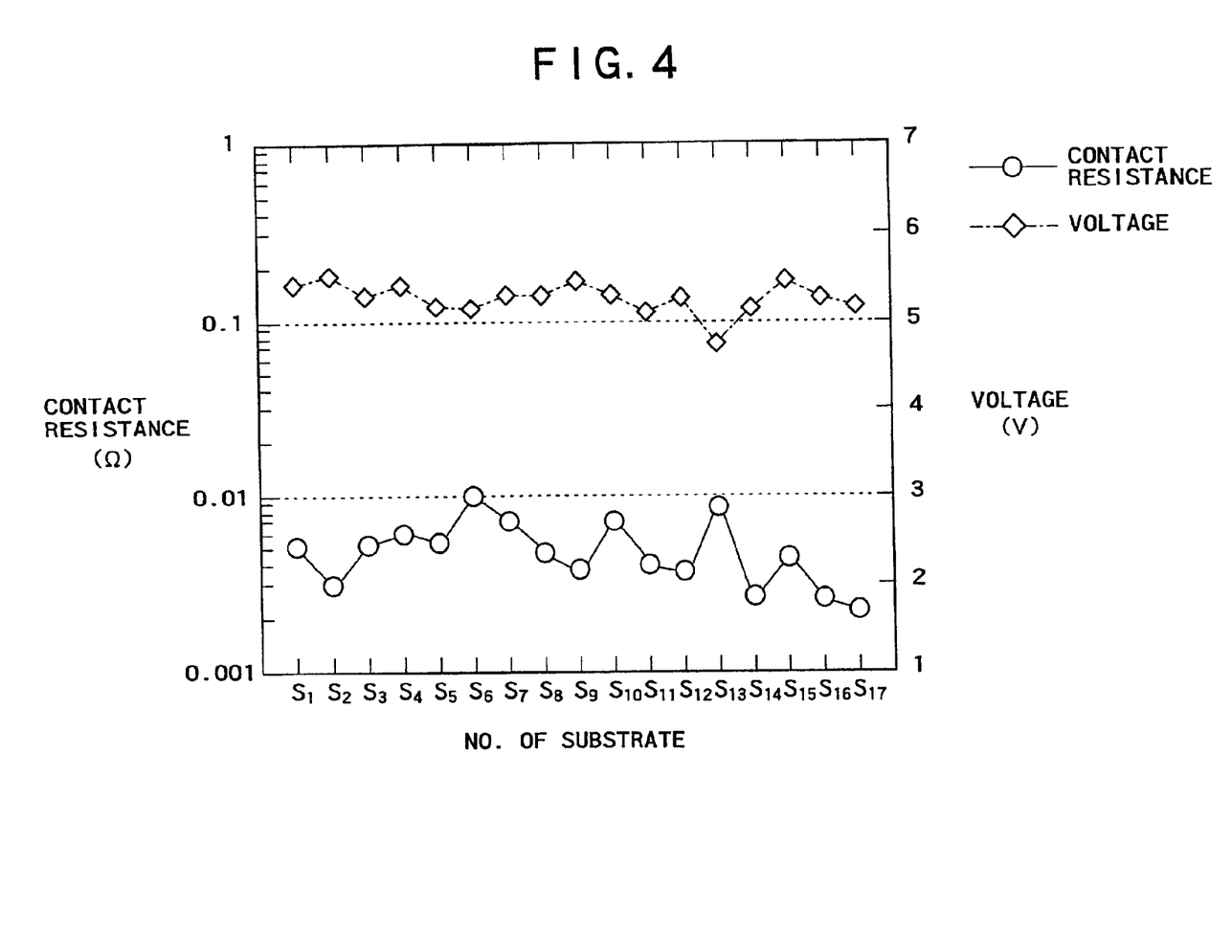
FIG. 4 is a characteristic diagram showing contact resistances and voltages of semiconductor lasers in Example 1 of the present invention.

Of the plurality of semiconductor lasers thus fabricated on each substrate 21, five pieces were selected as samples. The contact resistance and the voltage of a p-side electrode 31 of each sample were measured by applying a constant current of 50 mA to the sample. An average of the measurement values of the five samples for each substrate was obtained. The results are shown in FIG. 4.

Figure 5:
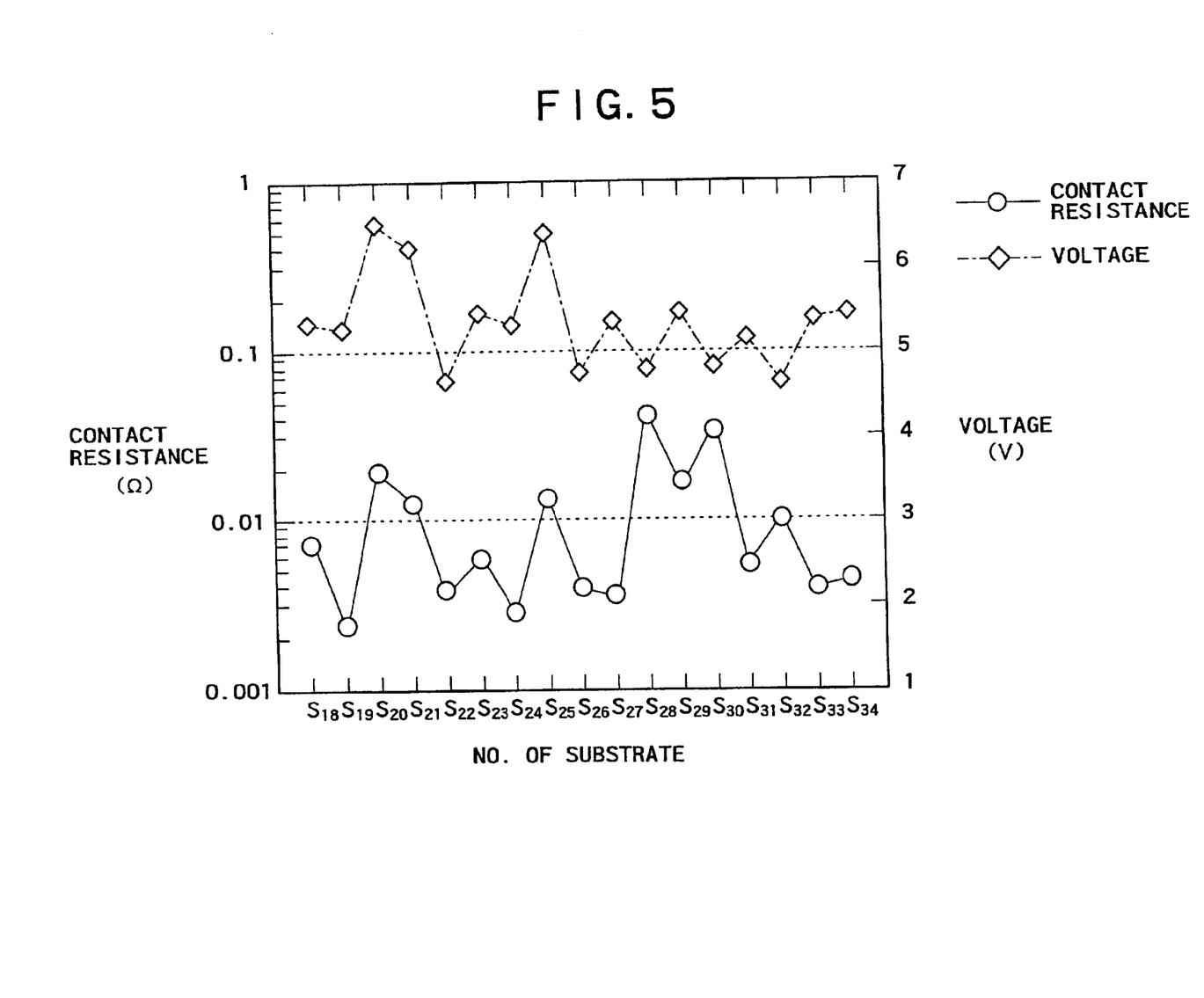
FIG. 5 is a characteristic diagram showing contact resistances and voltages of semiconductor lasers in Comparative Example 1, prepared for comparatively examining Example 1.

For examining the data obtained in Example 1 comparatively, an additional experiment was made as Comparative Example 1. A plurality of semiconductor lasers were fabricated on each of a plurality of substrates in the same manner as that described in Example 1, except that the surface treatment of the p-type contact layer 29 by irradiating the surface with ultraviolet rays in an atmosphere containing ozone was not performed in Comparative Example 1. The contact resistance and the voltage of each of five samples selected from the plurality of semiconductor lasers fabricated on each of the substrates and an average of the measurement values of the five samples for each substrate were obtained in the same manner as that described in Example 1. The results are shown in FIG. 5. It is to be noted that the substrates used in Comparative Example 1 are different from those used in Example 1.

Example 2

Two substrates 21 were prepared separately from those used in Example 1 and Comparative Example 1. As Example 2, a plurality of semiconductor lasers were fabricated on a half side of each of the substrates 21 in the same manner as that described in Example 1; and, as Comparative Example 2, a plurality of semiconductor lasers were fabricated on the remaining half of the substrate 21 in the same manner as that described in Example 1, except that the surface of a nitride semiconductor was not exposed to an atmosphere containing active oxygen. Of the plurality of semiconductor lasers fabricated in each of Example 2 and Comparative Example 2, a specific number, shown in Table 1, of the semiconductor lasers were selected from each of the substrates 21, to be taken as samples. The constant resistance and the voltage of a p-side electrode 31 of each sample were measured by applying a current of 50 mA to the sample, and an average value of the measured contact resistances and an average value and a standard deviation of the measured voltages for each substrate 21 were obtained. The results are shown in Table 1.

TABLE 1

|  | No. of Sub-strate | Contact Resistance ($\Omega$/cm) | Average Value of Voltage (V) | Standard Deviation of Voltage | Number of Measurement (Pieces) |
| --- | --- | --- | --- | --- | --- |
| Example 2 | $S_{35}$ | 0.0140 | 4.9 | 0.19 | 18 |
|  | $S_{36}$ | 0.0036 | 4.9 | 0.07 | 25 |
| Comparative | $S_{35}$ | 0.0340 | 5.8 | 0.11 | 14 |
| Example 2 | $S_{36}$ | 0.0370 | 5.5 | 0.52 | 30 |

As is apparent from FIG. 4, in the semiconductor lasers in Example 1, a difference in contact resistance between two of the substrates 21 is small and, similarly, a difference in voltage between two of the substrates 21 is small. On the contrary, in the semiconductor lasers in Comparative Example 1, as is apparent from FIG. 5, a difference in contact resistance between two of the substrates 21 is large and, similarly, a difference in voltage between two of the substrates 21 is large. As a result, it becomes apparent that a variation in characteristics can be reduced and stabilized by treating the surface of the p-type contact layer 29 in the atmosphere containing active oxygen before the activation of the p-type impurity.

As is apparent from Table 1, each of the contact resistances and voltages in Example 2 is smaller than that in Comparative Example 2. As a result, it becomes apparent that the contact resistance of the p-type contact layer 29 with the p-side electrode 31 can be reduced, and thereby the operational voltage can be reduced by treating the surface of the p-type contact layer 29 in the atmosphere containing active oxygen before the activation of the p-type impurity.

In the embodiments and examples, an oxide film has been formed by treatment in an atmosphere containing active oxygen; however, it may be formed by any other method within the scope of the present invention.

In the embodiments and examples, an oxide film has been removed immediately after activation of a p-type impurity; however, it may be removed at any time before formation of a p-side electrode. From the viewpoint of suppressing contamination of the surface of a p-type contact layer, the removal of the oxide film is preferably performed immediately before the formation of the p-side electrode.

In the embodiments and the examples, the method of fabricating a semiconductor device according to the present invention has been described by using a semiconductor laser as the semiconductor device; however, the method of the present invention can be applied to a method of fabricating any other semiconductor device, such as a field transistor.

In the embodiments and examples, the present invention has been described by way of the case of forming a p-side electrode on a p-type contact layer as a nitride semiconductor layer doped with a p-type impurity; however, the present invention can be extensively applied to the case of forming an electrode required to be brought into ohmic-contact with a nitride semiconductor layer doped with a p-type impurity.

In the embodiments and the examples, the nitride semiconductor has been formed by the MOCVD process; however, it may be formed by a MBE (Molecular Beam Epitaxy) process, a hydride vapor deposition process or a halide vapor deposition process. It is to be noted that the hydride vapor deposition process has a feature that hydride contributes to the reaction or the transfer of a source gas, and the halide vapor deposition process has a feature that halide contributes to the reaction or the transfer of a source gas.

In the embodiments and examples, a substrate made from sapphire has been used; however, the sapphire substrate may be replaced with a substrate made from any other material, such as GaN or SiC, within the scope of the present invention.

As described above, the method of fabricating a nitride semiconductor according to the present invention is advantageous in that since the surface of a nitride semiconductor is oxidized by treating the surface in an atmosphere containing active oxygen to form an oxide film thereon before activation of a p-type impurity, the surface of the nitride semiconductor can be prevented from being deteriorated by activation treatment and the rate of activating a p-type impurity can be enhanced. As a result, it is possible to reduce the contact resistance of an electrode with the nitride semiconductor in the case of bringing the electrode in ohmic-contact with the nitride semiconductor, and hence to lower the operational voltage.

The fabrication method according to the present invention also is advantageous in that since the oxide film is removed by treatment using at least one of an acid and an alkali after the activation of the p-type impurity, it is possible to lower further the contact resistance and, hence, to lower further the operational voltage.

While the preferred embodiments of the present invention have been described using specific terms, such description is for illustrative purposes only, and it is to be understood that changes and variations may be made without departing from the sprit or scope of the following claims.

What is claimed is:

1. A method of fabricating a nitride semiconductor, comprising the steps of:

forming a nitride semiconductor doped with a p-type impurity;

oxidizing the surface of said nitride semiconductor in an atmosphere containing active oxygen, to intentionally form an oxide film thereon; and activating the p-type impurity after oxidizing the surface of said nitride semiconductor and in the presence of said oxide film, to turn the conductive type of said nitride semiconductor into a p-type, said oxide film being present on the surface of said nitride semiconductor at the beginning of and during activation.

2. A method of fabricating a nitride semiconductor according to claim 1, wherein the thickness of the oxide film is in a range of 5 nm or less.

3. A method of fabricating a nitride semiconductor according to claim 1, further comprising the step of removing the oxide film after the activation of the p-type impurity.

4. A method of fabricating a nitride semiconductor according to claim 1, further comprising the step of cleaning the surface of said nitride semiconductor with an organic solvent after the formation of said nitride semiconductor and before the formation of the oxide film on the surface of said nitride semiconductor.

5. A method of fabricating a nitride semiconductor, comprising the steps of:

forming a nitride semiconductor doped with a p-type impurity;

treating the surface of said nitride semiconductor in an atmosphere containing active oxygen to intentionally form an oxide film thereon; and activating the p-type impurity after treating the surface of said nitride semiconductor and in the presence of said oxide film, to turn the conductive type of said nitride semiconductor into a p-type, said oxide film being present on the surface of said nitride semiconductor at the beginning of and during activation.

6. A method of fabricating a nitride semiconductor according to claim 5, further comprising the step of treating the surface of said nitride semiconductor with at least one of an acid and an alkali after the activation of the p-type impurity.

7. A method of fabricating a nitride semiconductor according to claim 5, further comprising the step of cleaning the surface of said nitride semiconductor with an organic solvent after the formation of said nitride semiconductor and before the treatment of the surface of said nitride semiconductor in the atmosphere containing active oxygen.

8. A method of fabricating a semiconductor device, comprising the steps of:

growing a nitride semiconductor layer doped with a p-type impurity;

oxidizing the surface of said nitride semiconductor in an atmosphere containing active oxygen layer to intentionally form an oxide film thereon; and activating the p-type impurity after oxidizing the surface of said nitride semiconductor and in the presence of said oxide film, to turn the conductive type of said nitride semiconductor layer into a p-type, said oxide film being present on the surface of said nitride semiconductor layer at the beginning of and during activation.

9. A method of fabricating a semiconductor device according to claim 8, wherein the thickness of the oxide film is in a range of 5 nm or less.

10. A method of fabricating a semiconductor device according to claim 8, further comprising a step of removing the oxide film after the activation of the p-type impurity.

11. A method of fabricating a semiconductor device according to claim 10, further comprising the step of forming an electrode on said p-type nitride semiconductor layer after the removal of the oxide film.

12. A method of fabricating a semiconductor device according to claim 8, further comprising the step of cleaning the surface of said nitride semiconductor layer with an organic solvent after the growth of said nitride semiconductor layer and before the formation of the oxide film on the surface of said nitride semiconductor layer.

13. A method of fabricating a semiconductor device, comprising the steps of:

growing a nitride semiconductor layer doped with a p-type impurity;

treating the surface of said nitride semiconductor layer in an atmosphere containing active oxygen to intentionally form an oxide film thereon; and activating the p-type impurity after treating the surface of said nitride semiconductor layer and in the presence of said oxide film, to turn the conductive type of said nitride semiconductor layer into a p-type, said oxide film being present on the surface of said nitride semiconductor layer at the beginning of and during activation.

14. A method of fabricating a semiconductor device according to claim 13, further comprising the step of treating the surface of said nitride semiconductor layer with at least one of acid and alkali after the activation of the p-type impurity.

15. A method of fabricating a semiconductor device according to claim 14, further comprising the step of forming an electrode on said p-type nitride semiconductor layer after the treatment of the surface of said nitride semiconductor layer with at least one of acid and alkali.

16. A method of fabricating a semiconductor device according to claim 13, further comprising the step of cleaning the surface of said nitride semiconductor layer with an organic solvent after the growth of said nitride semiconductor layer and before the treatment of the surface of said nitride semiconductor layer in an atmosphere containing active oxygen.

* * * * *

UNITED STATES PATENT AND TRADEMARK OFFICE
CERTIFICATE OF CORRECTION

PATENT NO. : 6,960,482 B2  
APPLICATION NO. : 10/184902  
DATED : November 1, 2005  
INVENTOR(S) : Osamu Matsumoto It is certified that error appears in the above-identified patent and that said Letters Patent is hereby corrected as shown below:

Column 10:

Line 51 should read: --said nitride semiconductor layer--.
Line 52, "layer" should be deleted.

Signed and Sealed this

Twenty-fourth Day of July, 2007

JON W. DUDAS  
*Director of the United States Patent and Trademark Office*